United States Patent

Kim et al.

[15] 3,691,628

[45] Sept. 19, 1972

[54] METHOD OF FABRICATING COMPOSITE INTEGRATED CIRCUITS

[72] Inventors: Chang Soo Kim, North Syracuse; Gerald G. Palmer, Liverpool, both of N.Y.

[73] Assignee: General Electric Company

[22] Filed: Oct. 31, 1969

[21] Appl. No.: 872,989

Related U.S. Application Data

[62] Division of Ser. No. 687,278, Dec. 1, 1967, abandoned.

[52] U.S. Cl. ........................29/577, 29/627, 29/626, 29/589

[51] Int. Cl. ............................B01j 17/00, H01l 1/16

[58] Field of Search...29/576 IW, 577, 589, 626, 627

[56] References Cited

UNITED STATES PATENTS

| | | | |
|---|---|---|---|
| 3,439,416 | 4/1969 | Yando | 29/577 X |
| 3,383,760 | 5/1968 | Shartzman | 29/576 IW |
| 3,405,442 | 10/1968 | Caracciolo | 29/627 |

*Primary Examiner*—John F. Campbell
*Assistant Examiner*—W. Tupman
*Attorney*—Marvin A. Goldenberg, Richard V. Lang, Frank L. Neuhauser, Oscar B. Waddell and Joseph B. Forman

[57] ABSTRACT

Method of fabricating integrated circuits in which individual semiconductor chips, exhibiting diverse electrical and compositional characteristics may in combination with thin or thick film passive components be applied to a single supporting dielectric substrate, wherein there are provided readily formed coplanar connections to the chips and an ease of registration of the chips with respect to one another and to conductive patterns carried by the substrate. The chips are bonded to the dielectric substrate by means of a strongly adhesive, chemically inert, high quality dielectric material, said chips being applied with the metalized surface thereof flush with that of the dielectric material so that a continuous supporting structure is formed for said coplanar connections. In one specific embodiment the conductive patterns are deposited both on the substrate surface and on the dielectric layer surface, the patterns being connected by extending portions thereof through the dielectric layer.

2 Claims, 14 Drawing Figures

INVENTORS:
CHANG SOO KIM,
GERALD G. PALMER,
BY
THEIR ATTORNEY.

INVENTORS:
CHANG SOO KIM,
GERALD G. PALMER,
BY [signature]
THEIR ATTORNEY.

METHOD OF FABRICATING COMPOSITE INTEGRATED CIRCUITS

The present application is a division of application Ser. No. 687,278, filed Dec. 1, 1967, now abandoned.

BACKGROUND OF THE INVENTION

1. Field of the Invention

The invention relates to the field of integrated circuits and, more specifically, to that part of the field wherein a number of active components in the form of semiconductor chips are combined on a single substrate with passive film components for providing a wide range of circuit functions. As used in the present discussion, semiconductor chips are intended to include within their meaning all forms of miniaturized electronic components in packaged or quasi packaged form, such as monolithic chips, beam lead devices, hybrid devices, etc., which can be mounted and interconnected on a single substrate.

2. Description of the Prior Art

In recent years much work has been performed in the field of integrated circuits directed to the goal of fabricating micro-miniature electronic circuits of high complexity on a single supporting substrate. These efforts are generally divided into two categories, one termed a monolithic approach and the other a hybrid approach. In the monolithic a number of active devices, such as transistors and diodes, and resistive and capacitive passive components are fabricated from a single wafer of semiconductor material by means of conventional semiconductor processing techniques, i.e., diffusion, alloying, evaporation, etc. The various active and passive components are interconnected by metalization normally evaporated on the wafer surface. Photolithographic techniques are employed in the processing to achieve extremely small dimensions of all components. Accordingly, by means of this approach, a high degree of miniaturization can be accomplished.

However, the monolithic approach does have a number of inherent limitations. It is basically an inflexible process. Thus, should any single component on a monolithic chip prove bad, either the entire chip must be replaced or a discretionary interconnection of the components must be made from which the bad component or components are excluded. The latter, however, adds considerable complexity to automated processing techniques. It may be appreciated that the noted inflexibility of the monolithic circuit become particularly burdensome for large scale integration. As a further limitation, since both active and passive components are fabricated from a single piece of semiconductor material, normally silicon, restrictions exist as to the choice of components in the circuit design. Thus, the active components must all be of a similar type so that, for example, both tunnel diodes and transistors cannot be fabricated on a single monolithic chip, nor can many different type transistors, etc. Further, only a limited range of resistance and capacitance, and no inductance at all, can be provided.

In addition, isolation between components is normally provided by back-biased p-n junctions, which isolation is often insufficient, especially for high frequency operation, for example above 100 MHz. More recently dielectric isolation has been employed for improving the degree of isolation between components. Dielectric isolation is accomplished either by merely etching excess silicon material around the active components or by replacing the silicon with a dielectric material such as glass. This form of isolation, however, requires special processing techniques.

With respect to the hybrid approach, in general, individual semiconductor chips, each of which may include one or more active components normally processed using monolithic techniques, are applied to a supporting substrate and the individual chips interconnected. The outstanding advantages of this approach are that dissimilar active devices can be combined in an integral circuit on a single substrate, and chips can be tested and replaced individually as required. Further, using either thin film or thick film techniques, a relatively wide range of passive components of a resistive, capacitive or inductive type can be formed on the substrate and incorporated in the interconnection structure.

However, because the individual chips have a finite thickness on the order of several mils, a problem is presented with respect to providing connections between the chips and the conductor strips on the supporting substrate. Presently, the most common procedure is to apply the semiconductor chips to the supporting substrate with the metalization up. Extremely fine wires, normally of gold, are then connected to the contact pads on the chip and to terminals on the substrate by ultrasonic bonding, compression welding or other techniques known to the art. This procedure must be performed by hand and is uneconomical. In addition, the contacts made are unreliable and easily broken.

In a more recent development, complete conductive patterns are first formed on the surface of the supporting substrate and the semiconductor chips are then applied to the substrate metalization down, commonly known as the "flip-chip" method. In this method tiny metal balls are formed either on the chip or on terminals of the substrate and contact is made between the chips and the conductive patterns by soldering at the points where the balls are formed. Whereas the flip-chip method is satisfactory for relatively large dimensioned structures, it cannot readily be employed for high density, high resolution work, or where a relatively large number of solder connections are to be made.

SUMMARY OF THE INVENTION

It is accordingly a principal object of the present invention to provide a novel method of fabricating a structure which combines the outstanding features of existing monolithic technology with the outstanding features of existing hybrid technology while at once obviating many of the limitations associated with these technologies when taken individually.

It is a further object of the invention to provide a novel method of fabricating an integrated circuit structure having individual semiconductor chips exhibiting diverse electrical and compositional characteristics applied to a single supporting substrate in combination with film processed passive circuit components wherein connection to said chips may be accurately performed by coplanar metalization techniques conventionally employed in monolithic processing.

It is a further object of the invention to provide a novel method of fabricating an integrated circuit structure wherein batch processing techniques can be employed for fabricating the passive components and the entire interconnection arrangement.

It is yet a further object of the invention to provide a novel method of fabricating an integrated circuit structure as described above which incorporates multilayer interconnections.

It is still another object of the invention to provide a novel method of fabricating an integrated circuit structure in which a semiconductor chip can be permanently bonded to a supporting substrate with its metalization facing away from the substrate and wherein electrical connection can be made to the chip without requiring wire leads or similar suspended connecting structure.

These and other objects of the invention are accomplished by a method of fabrication which includes overlaying one surface of a rigid dielectric substrate with a strongly adhesive dielectric material for bonding to said substrate a number of semiconductor chips having metalized contact electrodes. The substrate further supports conductor strips having terminal electrodes intended to be connected to said contact electrodes. The chips are bonded to the substrate with said contact electrodes in registry with said terminal electrodes and with the contact and terminal electrodes contiguous with the surface of said adhesive material. Metalization is deposited on the surface of the adhesive material extending between the contact and terminal electrodes for providing coplanar connection to the chips. The coplanar connections are formed by photolithographic processing.

In one specific embodiment of the invention, conductive strips are deposited directly on the surface of the supporting substrate with a layer of said adhesive material overlaying the substrate surface and said strips. The terminal electrodes are provided by mesa formations at various points on the conductive strips, the mesas extending through the surface of the adhesive material to be flush with said surface. The semiconductor chips are embedded into the bonding layer face up, with the contact electrodes also flush with the surface of adhesive material so as to permit coplanar connections between the contact electrodes on the chips and the formed mesa structures.

BRIEF DESCRIPTION OF THE DRAWING

The specification concludes with claims particularly pointing out and distinctly claiming the subject matter which is regarded as the invention. It is believed, however, that both as to its organization and method of operation, together with further objects and advantages thereof, the invention may be best understood from the description of the preferred embodiments, taken in connection with the accompanying drawings in which:

DESCRIPTION OF THE PREFERRED EMBODIMENTS

Figures 1A, 1B:
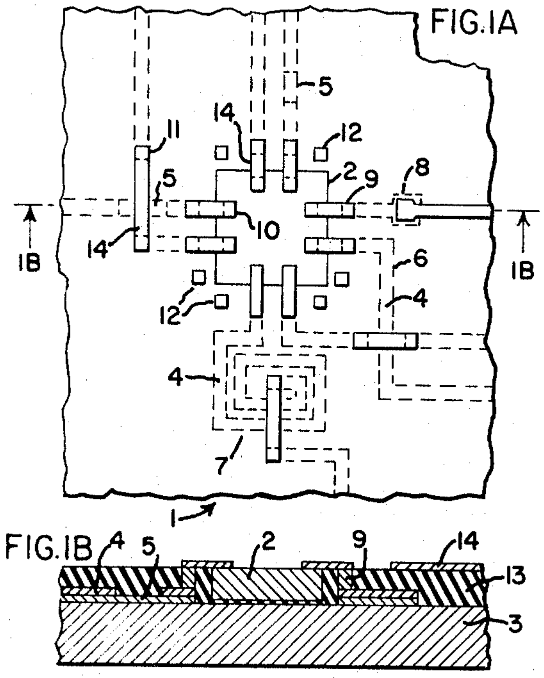
FIG. 1A is a plan view of an integrated circuit structure segment, in accordance with a first embodiment of the invention, illustrating a single semiconductor chip and its external connection.
FIG. 1B is a cross sectional view of FIG. 1A taken along the plane 1B—1B.

With reference to FIG. 1A, there is illustrated in plan view an integrated circuit structure segment 1 in accordance with a first embodiment of the invention. For purposes of explanation, only a portion of a complete circuit structure, greatly enlarged has been shown to facilitate explanation of the invention, including a single semiconductor chip 2 mounted on a supporting substrate 3, identified in FIG. 1B, in combination with interconnecting conductors and passive circuit components. The invention offers complete flexibility in bonding numerous different type semiconductor chips to a common substrate selected from a number of materials and for employing a wide range of passive components in the interconnecting structure. As specific features of the illustrated structure, it makes possible coplanar connections directly to the chip, which can be readily performed by photolithographic techniques commonly employed in monolithic fabrication; it accommodates crossover connections in the interconnection structure; and additional processing of the chip, such as etching to provide dielectric isolation, can be performed subsequent to mounting of the chip on the substrate.

The supporting substrate 3 is a dielectric material of good insulating properties, typically alumina ($Al_2O_3$), beryllia or glass for both low and microwave frequency applications. The embodiment under consideration employed alumina. Where relatively large values of inductance are to be provided in the peripheral circuitry, for example above 75 nanohenries, ceramic magnetic materials exhibiting a wide range of magnetic properties, such as ferrite or garnet, may be used as the substrate. Ferrite or garnet materials can also be employed for microwave applications. The thickness of the substrate is typically on the order of 20 to 30 mils.

Overlaying the substrate surface are formed thin layer conductive patterns which include a high conductivity material 4 such as gold, aluminum or copper, and a resistive material 5, such as chromium or nichrome. The conductive patterns serve to interconnect the semiconductor chip 2 to other chips common to the substrate 3 and to external terminals on the substrate 3, which are not shown in FIG. 1A. Strips 6 of the high conductivity material 4 serve as conductors. In a configuration of close electromagnetic coupling, the conductor strips may provide inductance as shown with respect to the inductor component 7. The conductive material 4 may be also formed in a relatively wide area to serve as one electrode of a capacitance component, shown with respect to the capacitor 8.

The resistive material 5 directly overlays the substrate surface and the high conductivity material 4 overlays portions of the resistive material, as best illustrated in the cross sectional view of FIG. 1B taken along a plane 1B—1B in FIG. 1A. It is noted that for purposes of illustration the view of FIG. 1B is not in precise proportion. The conductive patterns formed of the highly conductive material 4 and the resistive material 5 are processed using conventional additive or subtractive techniques.

A plurality of terminal electrodes 9 are constructed at end points on the conductor strips for making coplanar connection directly to contact electrodes 10 on the semiconductor chip 2. The electrodes 9 are mesa structures that extend above the conductive patterns, as seen in FIG. 1B. Further mesa structures 11 are formed at intermediate points on the conductor strips 6 for providing crossover connections. In addition, registration mesas 12 are formed on the substrate surface with the same thickness as the mesas 9, which position the semiconductor chip 2 on the substrate surface with linear and radial accuracy.

A layer of dielectric bonding material 13 overlays the conductive patterns with the mesa formations extending through said layer so as to be flush with the surface. In the embodiment under consideration the thickness of the layer 13 is about 2 mils. The semiconductor chip 2 is embedded within the dielectric layer 13 so as to be firmly bonded to the substrate. The chip 2 is embedded face up with the contact pads 10 flush with the surface of the bonding material 13. Although the conventional aluminum metalization for the contact pads may be suitable for many applications, it is preferable that the chip have a non-oxidizing metalization, of which gold is the most common, for providing the most reliable electrical connection thereto.

A fluorinated ethylene propylene (FEP) Teflon has been employed as the bonding material 13. It is a thermoplastic material having a number of properties that make it eminently suitable for the present use. The material provides a strong bond at heating temperatures that are below the eutectic temperatures of the metalization on the substrate surface and on the semiconductor chip, and yet remains hard over a suitable range of operating temperatures. It possesses extremely good dielectric properties over a wide range of frequencies. FEP Teflon is chemically inert so as to be highly resistant to most etch solutions. It resists shrinkage and accommodates strains well within the material so that once the bond is formed bonded surfaces remain secure. Further, the material is highly moisture resistant and exhibits good temperature stability. It is recognized that other materials within the family of thermoplastics, and also outside, which possess comparable properties to those described can also be employed for the bonding layer as appropriate to a given application. For example, a number of the fluoroplastics appear to be suitable materials, such as chlorotrifluoroethylene under the trade names of Kel-F or Plaskon, polyvinylidene fluoride under the trade name of Kynar or polyphenylene oxide.

The semiconductor chip 2 can be one of a number of chips commercially available, or be a specially fabricated chip, providing operation ranging from a simple circuit function to a systems function. It may include from a single to a large number of active components, such as transistors, diodes or tunnel diodes, directly connected together or connected in combination with passive components. Although the invention is contemplated to have principal application relative to highly miniaturized chips, and in particular of the monolithic type, it is also useful with respect to providing interconnection for hybrid or other integrated circuit devices of somewhat larger dimensions than monolithic. The present embodiment contemplates a chop dimension of about 40 mils square and a thickness of 1½ to 2 mils. Commercial monolithic chips which are normally 7 to 10 mils thick can readily be lapped to achieve this thickness. It should be clear, however, that for purposes of the invention neither the internal construction, the electrical arrangement nor the overall dimensions of the chips are critical.

Overlaying the surface of the dielectric material 13 are formed further conductor strips 14 which connect the mesa electrodes 9 to the contact pads 10 for providing coplanar connection between the semiconductor chip 2 and the peripheral circuitry. In addition, the conductor strips 14 extend between the mesa electrodes 11 for providing crossover connections as may be required. Also formed on the surface of the dielectric material 13 is the second electrode of the capacitor 8. It is noted that relatively small capacitance is exhibited by the capacitor 8 because of the thickness of the dielectric layer 13. However, considerably larger capacitance can readily be provided on the surfaces of the substrate or bonding layer by comparable techniques.

Figures 2A, 2B:
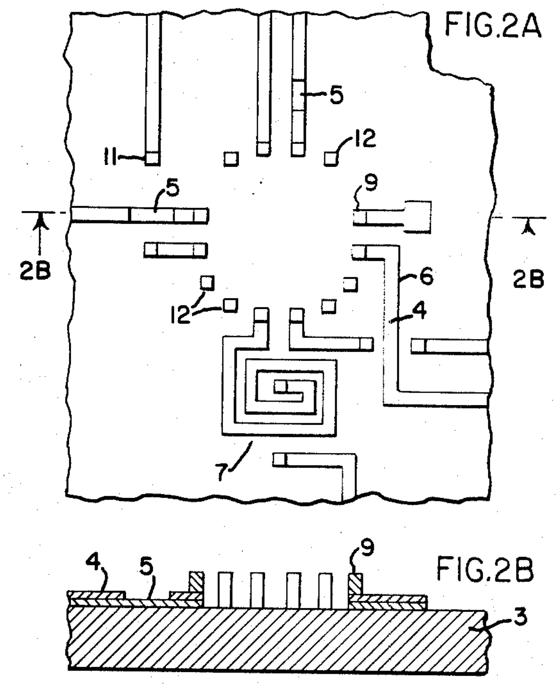
FIG. 2A is a plan view of the structure of FIG. 1A after the completion of a first stage in the fabrication process with a conductive pattern overlaying the substrate surface.
FIG. 2B is a cross sectional view of FIG. 2A taken along the plane 2B—2B.
Figures 3A, 3B:
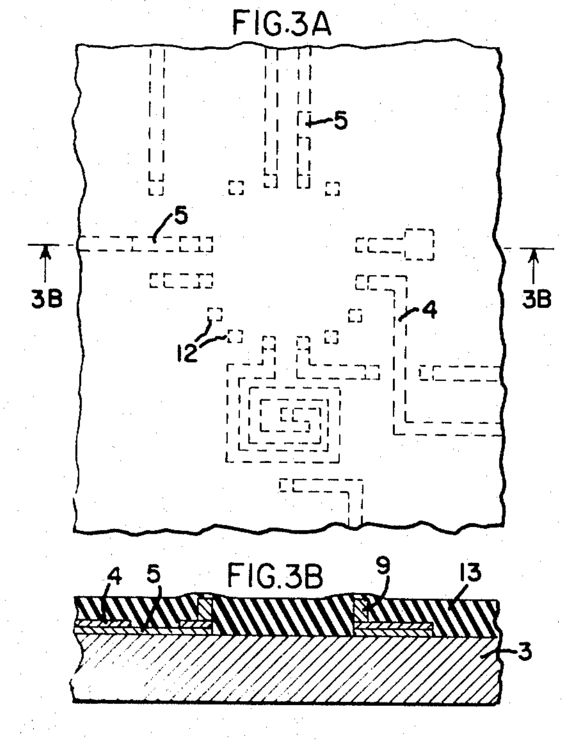
FIG. 3A is a plan view of the structure of FIG. 1A after a second stage in the fabrication process with a bonding material over the conductive pattern.
FIG. 3B is a cross sectional view of FIG. 3A taken along the plane 3B—3B.

By referring to FIGS. 2A through 4B, fabrication of the present integrated circuit structure will be considered in greater detail. In the plan view of FIG. 2A and the cross sectional view of FIG. 2B taken along the plane 2B—2B in FIG. 2A, is shown the structure 1 at a first stage in the fabrication when the conductive patterns and the mesa formations have been completed on the surface of the substrate 3. In one processing operation, the substrate 3 initially has a continuous layer of the resistive material 5, in the present case chromium, deposited over the entire surface. The resistive layer is applied by conventional metalization processing, typically evaporation, to a thickness of from 500 to 1,000 angstroms. The entire surface of the material 5 is coated with a photoresist material, e.g., Kodak Ortho Resist, which is a negative photoresist. By conventional optical procedures used in photolithography, a first exposure is made through a photo mask which defines a pattern of the chromium to be retained, said pattern including all highly conductive areas as well as the resistive areas. The etch solution employed in the developing process is one which selectively attacks the unexposed chromium. Thus, all but the retained pattern of chromium is removed down to the substrate.

The surface is then cleaned and a second coat of photoresist material is applied. A second exposure is made through a photo mask which defines a pattern of the highly conductive material to be deposited, in the present case, gold. Thus, windows are formed in the photoresist layer and gold evaporated through them to form the conductor strips and other highly conductive areas with a thickness of about 5 to 7 microns.

The conductor and resistive strips can also be formed by a subtractive process wherein continuous layers of chromium or gold are deposited onto the substrate. The gold is first selectively etched down to the chromium by photolithographic techniques to define a pattern including all highly conductive areas. The chromium is then selectively etched to form the resistive strips.

The mesa structures are formed of a highly conductive metal capable of being applied to a thickness of several mils; copper is a suitable metal for this purpose. Accordingly, the surface thus far formed is cleaned and a thin film of copper evaporated over the entire area. A thick film of copper is then electroplated over the surface commensurate with the height at which the mesas are to be constructed. In the embodiment under consideration, copper is electroplated to a thickness on the order of 2 mils. The surface is then cleaned and the photoresist is applied. A third photo mask, which defines a pattern of the mesa structures is next employed and the copper selectively exposed through said mask. In developing the mesa formations, an etch solution is employed that attacks the unexposed copper, but not the gold or chromium. In the present embodiment of the invention the electrode mesas 9 and 11 and the registration mesas 12 are the same height. The mesas 12 are constructed directly on the dielectric substrate and are electrically isolated from the remainder of the structure.

In the following steps of the process, the bonding layer is applied to the substrate over the conductive patterns and mesa formations. In the application of FEP Teflon as the bonding layer, a FEP dispersion primer material is first applied to the surface. This can be sprayed on or applied with a dropper and spun off. The primer is fused by heating to about 370° C. Following the application of the primer, a sheet of FEP Teflon having a thickness equal to the height of the mesa formations is then pressed at approximately 320° C and a pressure of between 100 to 500 psi. At this stage in the fabrication the structure appears as illustrated in the plan view of FIG. 3B taken along the plane 3B—3B in FIG. 3A.

Figures 4A, 4B:
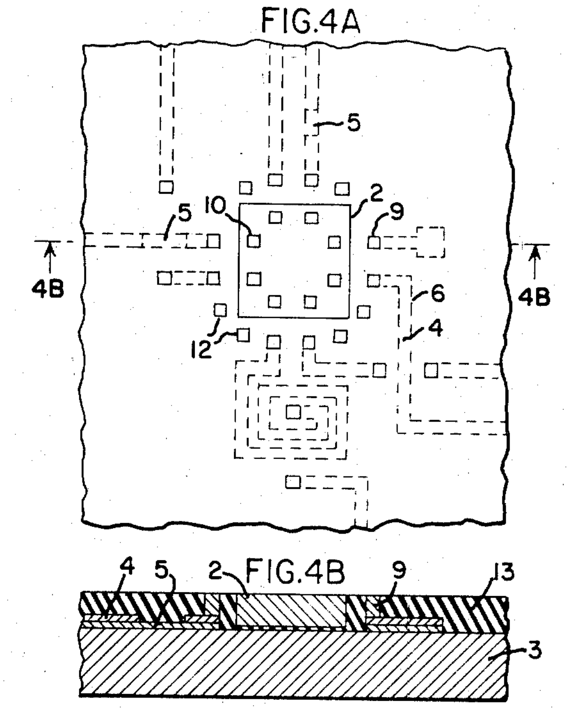
FIG. 4A is a plan view of the structure of FIG. 1A after a third stage in the fabrication process with the semiconductor chip embedded within the layer of bonding material.
FIG. 4B is a cross sectional view of FIG. 4A taken along the plane 4B—4B.

The semiconductor chip 2 is then placed in registry with the mesa formations 12 and pressed, face up, as shown in the plan view of FIG. 4A and the cross sectional view of FIG. 4B. In order that there by provided an accurate registration of the chip contact electrodes 10 with the terminal electrodes 9, the metalization pattern on the chip must be precisely referenced to the edges of the chip. Embedding of the chip is accomplished with a platen heated to about 320° C and exerting a pressure of between 100 to 500 psi so that the contact electrodes are flush with the surface of the Teflon and the mesa formations extend through said surface and are also flush therewith. As the chip is pressed into the heated Teflon, the molten material spreads laterally around the mesa structures. A fine grinding operation may be performed at this stage to remove any film of Teflon that may have remained on the surface of the mesa structures. Details of a specific process employed for embedding the semiconductor chip so as to be flush with the Teflon surface within a tolerance of a fraction of a micron is fully described in a copending application entitled "A Method of Embedding Semiconductor Chips Within a Dielectric Layer so as to be Flush with Surface," Ser. No. 687,195, filed Dec. 1, 1967 by Gerald G. Palmer, and assigned to the assignee of the present invention.

In the final step of the process a highly conductive, preferably non-oxidizing metal, typically gold, is evaporated over the entire surface thus far formed to a thickness of about one micron. A photoresist material is then deposited over the gold. A final exposure is then made through a final photo mask which contains the conductive pattern to be formed on the surface of the Teflon layer. The pattern includes that of the conductor strips 14 and the second capacitor electrode. The surface conductive pattern, formed upon the application of an etch solution which attacks the unexposed gold, is illustrated in FIGS. 1A and 1B. In this process it is desirable that the metalization on the chip be substantially thicker than the evaporated gold so that the etching procedure is not unduly critical.

An additive process can alternatively be employed for forming the surface conductive pattern wherein the photoresist layer is first formed over the entire surface and exposed through a photo mask for providing windows in the photoresist layer where the conductive pattern is to be. Gold is then evaporated through the windows to complete the process.

Only conductive strips have been shown on the bonding layer surface in FIGS. 1A and 1B. However, it should be clear that all of the passive components can also be formed on this surface. Further, although only a limited number and form of passive components have been included for purposes of illustration, a wide range of such components may be employed in accordance with the state of the art.

Figure 5A:
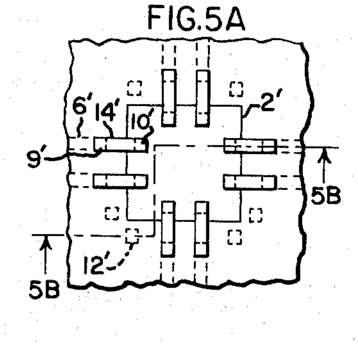
FIG. 5A is a plan view of an embedded chip and surrounding mesa formations, illustrating a second embodiment of the invention.
Figure 5B:
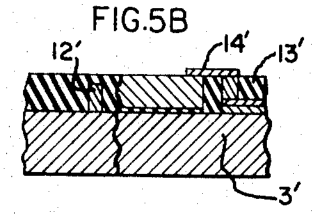
FIG. 5B is a cross sectional view of FIG. 5A taken along the interrupted plane 5B—5B.

FIGS. 5A and 5B are plan and interrupted plane cross sectional views, respectively, of an alternate embodiment of the foregoing structure. Components corresponding to those previously illustrated are identified by the same reference characters but with added prime notations. Accordingly, a chip 2' is embedded in a dielectric bonding layer 13' and mounted on a dielectric substrate 3'. Only that portion of the peripheral structure which includes the registration and terminal electrode mesas 12' and 9', respectively, conductor strips 6' on the substrate surface and conductor strips 14' connecting electrodes 9' to contact pads 10' are shown. In accordance with the present embodiment the registration mesa formations 12' are constructed to a height less than the electrode mesas formations 9'. Accordingly, the registration mesas 12' are slightly below the surface of the bonding layer 13'. The advantage of this construction is that electrical isolation of the mesas 12' from the surface connections is built into the structure.

Figure 6A:
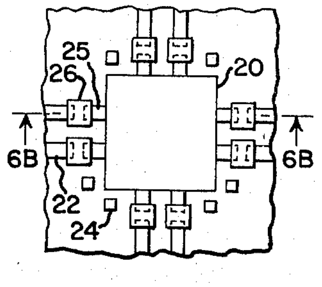
FIG. 6A is a plan view of an integrated circuit structure segment in accordance with a further embodiment of the invention.
Figure 6B:
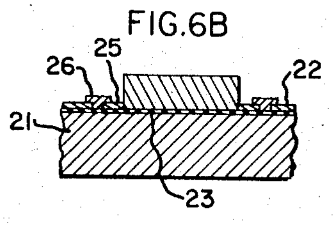
FIG. 6B is a cross sectional view of FIG. 6A taken along the plane 6B—6B.

A third embodiment of the invention is illustrated in the plan view of FIG. 6A and the cross sectional view of FIG. 6B taken along the plane 6B—6B in FIG. 6A in which a semiconductor chip 20 is mounted onto a supporting dielectric substrate 21 of similar composition to that previously considered, and a coplanar connection is made between the chip and conductor strips 22 carried by the substrate. In this embodiment the chip 20 is bonded to the surface of the substrate by means of a thin film adhesive material 23 approximately several microns thick. An FEP Teflon primer is a suitable adhesive material. The FEP Teflon primer may be applied by being sprayed onto the substrate surface or applied by a dropper and spun off. It is then fused to the surface at a temperature of about 370°. The conductive strips 22 overlaying the adhesive film 23 are typically of a gold metalization applied by conventional deposition processes, such as by evaporation of a continuous layer followed by selective etching through a photo mask, similar to that previously described with respect to the first embodiment of the invention. The chip 20 is applied to the adhesive surface of the substrate face down and adhered at a temperature of about 320° C and a pressure of about 100 to 500 psi applied by a platen. Registration mesas 24 are formed over the substrate surface for providing accurate linear and radial registration of the chip 20.

The semiconductor chip is applied with its contact pads 25 in a coplanar relationship with the conductor strips 22. The contact electrodes 25 are exposed from the upper side by a selective etching process which may be performed either before or after the chip is bonded to the substrate. Etching subsequent to bonding offers the advantage of the contacts pads being firmly supported by the body of the chip during the bonding process. If the chip is etched prior to bonding, a conventional beam lead process may be employed in which the exposed contact electrodes 25 are stiffened by being made with appreciable thickness, on the order of one half mil. The contact electrodes 25 are connected to the conductor strips 22 by abbreviated conductor strips 26 which overlay the ends of strips 22 and electrodes 25, employing a photolithographic process similar to that previously described. In this embodiment, passive components may be deposited on the surface of film 23.

Figure 7:
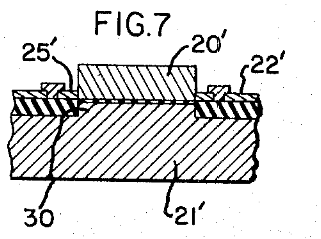
FIG. 7 is a modified embodiment of FIG. 6B.

It may be desirable to provide a broad mesa structure 30 of dielectric material having a thickness on the order of 1 to 2 mils on the substrate surface directly beneath the chip 20, as illustrated in the cross sectional view of FIG. 7 which is a modification of FIG. 6B. The mesa structure 30 permits employment of a bonding layer 23′ of at least the thickness of the broad mesa structure, and still have the contact electrodes 25′ of the mounted chip overlaying the surface of the bonding layer and in coplanar relationship with the conductor strips 22′. The broad mesa structure may be formed directly from the substrate during its fabrication. This structure permits passive components to be applied as with respect to the first embodiment.

Figure 8:
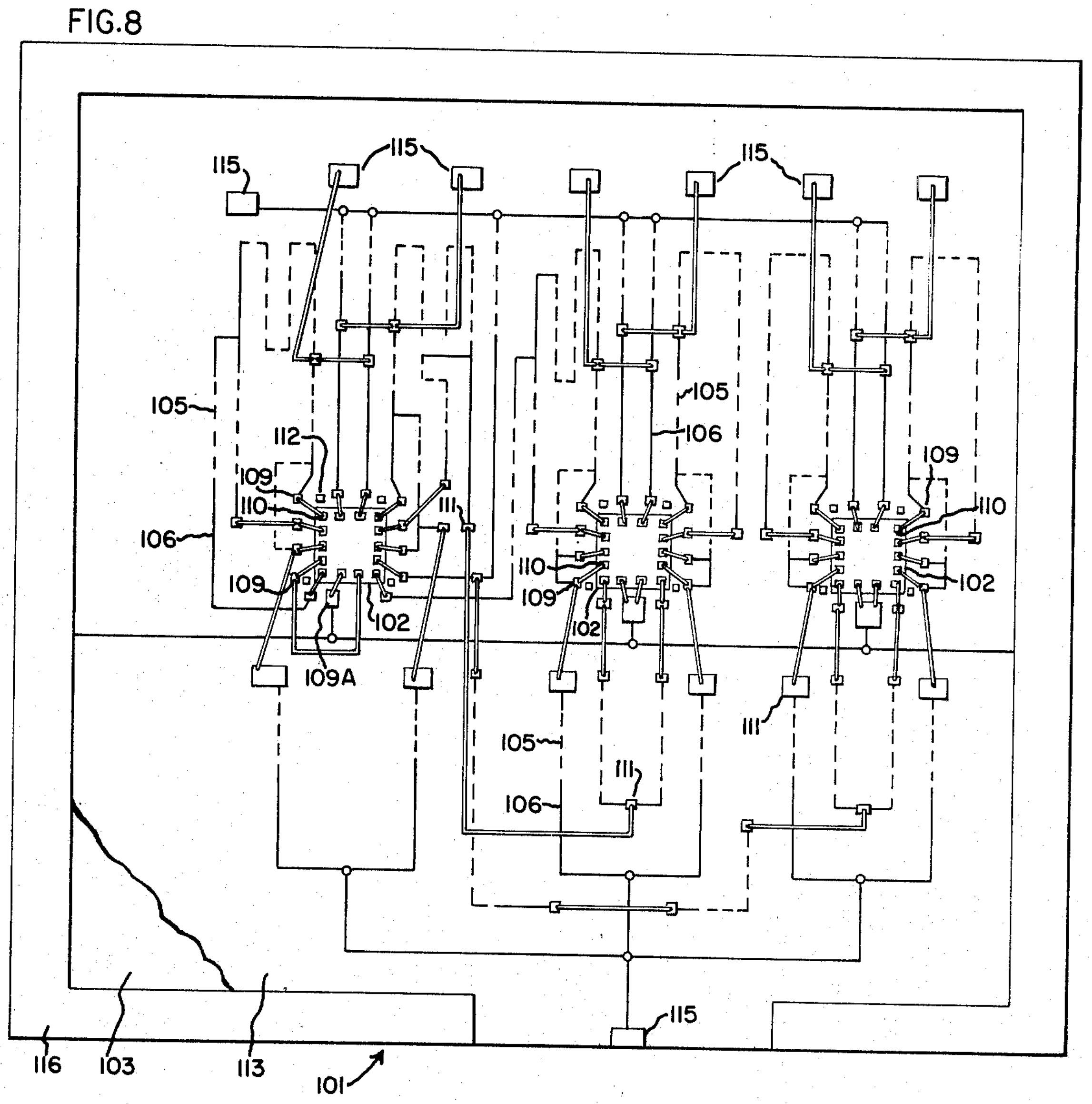
FIG. 8 is a plan view of a digital integrated circuit structure constructed in accordance with the first embodiment of the invention.

In FIG. 8 there is illustrated a plan view of an integrated circuit structure 101 which performs a digital operation. As will be seen the structure corresponds to that described in the first embodiment of the invention illustrated in FIGS. 1A through 4B. It should be pointed out that the illustrated structure, although performing a complete circuit function, is nevertheless on a relatively modest scale and serves principally as one specific example of the form of large scale integration made possible by the present invention.

Three semiconductor chips 102 are illustrated which are mounted on a supporting dielectric substrate 103 by being embedded face up within bonding layer 113. In the operable embodiment of the invention being considered the semiconductor chips are of monolithic construction and each include several transistor components. The dielectric substrate is of alumina, and FEP Teflon is employed as the bonding layer. Overlaying the substrate surface are formed resistive strips 105, which are of chromium, and conductor strips 106, which are of gold, these strips being fabricated by evaporation of the metals and selective etching as previously described. The chromium strips 105 are schematically illustrated by single broken lines and the gold strips 106 by single solid lines, although as actually fabricated these strips are applied in a well known manner with varying widths in accordance with the resistance values assigned to the resistive strips. A plurality of terminal electrode mesa structures 109, here of electroplated copper, are constructed around the chips 102 for making coplanar connections directly to contact pads 110 on the chips. The mesa structures 109 are constructed at end points on the conductor strips 106 as well as directly on the substrate 103. A plurality of mesa structures 111 are also constructed at intermediate points on the conductor strips 106 for providing crossover connections. In addition, registration mesa formations 112 are constructed directly on the substrate surface for accurately positioning the chips 102 so that the contact pads 110 are in precise registration with the terminal electrodes 109. In the illustrated embodiment electrode mesa structures 109A provide a common ground connection to the chips and also serve as registration mesas.

Additional mesa formations 115 serve as external terminals of the overall structure for providing input and output connections to the circuit. Finally, a mesa formation 116 is constructed around the periphery of the structure which serves a dual function, one being to act as a common ground for the circuit. Since all the mesa structures are constructed to be at the same level as the bonding layer 113, the mesa 116 can also be employed as a stop in the embedding process in which a platen is used to press the chips 102 into the bonding layer 113.

Conductor strips 114 evaporated over the surface of the bonding layer make coplanar connections between the terminal electrode mesas 109 and the contact electrodes 110. Further conductor strips 114 make coplanar connections to mesa formations 111 for providing crossovers of the conductive patterns formed on the substrate surface. As described with respect to the foregoing embodiments, the conductive strips 114 are evaporated onto the surface of the bonding layer and selectively etched by means of a photolithographic process for providing an accurate and automated formation of these strips. Accordingly, the entire interconnection structure can be fabricated by batch processing techniques.

Although the invention has been described with respect to a limited number of specific embodiments for the purpose of clear and complete disclosure, the invention is not intended to be thus narrowly constructed. It is recognized that numerous modifications can be made to the structure disclosed by ones skilled in the art which would not exceed the basic invention taught. For example, direct coplanar connections between chips by the surface conductor strips can be readily made. The bonding layer may be made considerably thicker than disclosed, for example on the order of 10 mils, so as to permit large dimensioned chips to be embedded. Further, an extension of the presently disclosed concepts may be realized by performing a second level integration wherein the disclosed integrated circuit structures are themselves mounted as chips upon a further substrate and interconnected.

Accordingly, the principle of the invention herein set forth may be appreciated to be applicable in providing numerous integrated circuit structures wherein many different type semiconductor chips are combined with passive components of different types and values for performing a wide range of circuit operations. The appended claims are meant to include within their ambit all modifications and variations of the structure and methods herein described which can reasonably be found to fall within the true scope of the invention.

What we claim as new and desire to secure by Letters Patent of the United States is:

1. A method of fabricating an integrated circuit structure comprising the steps of:

a. employing photolithographic techniques to deposit a conductive pattern including terminal mesa structures on the surface of a substantially planar substrate, b. overlaying the substrate surface including said conductive pattern with a layer of thermoplastic dielectric material with said mesa structures extending up through said material, c. registering a semiconductor chip having contact electrodes face up on the surface of said layer of dielectric material, d. heating said dielectric material, e. pressing said semiconductor chip into said layer of dielectric material until said contact electrodes become flush with the dielectric layer surface, and f. employing photolithographic techniques to deposit strips of electrically conductive material on said dielectric surface so as to make connection to said contact electrodes and said mesa structures.

2. A method of fabricating an integrated circuit structure comprising the steps of:

a. employing photolithographic techniques to deposit a conductive pattern including terminal mesa structures on the surface of a substantially planar substrate, b. overlaying the substrate surface including said conductive pattern with a layer of thermoplastic dielectric material, c. embedding a semiconductor chip having contact electrodes on one face thereof within said layer of dielectric material, and d. employing photolithographic techniques to deposit strips of electrically conductive material on the surface of said layer of dielectric material so as to make connection to said contact electrodes and said mesa structures.

* * * * *